United States Patent [19]

Nenadic et al.

[11] Patent Number: 5,084,071

[45] Date of Patent: Jan. 28, 1992

[54] METHOD OF CHEMICAL-MECHANICAL POLISHING AN ELECTRONIC COMPONENT SUBSTRATE AND POLISHING SLURRY THEREFOR

[75] Inventors: Anton Nenadic, Red Hook; Robert W. Pasco, Wappingers Falls, both of N.Y.

[73] Assignee: International Business Machines Corporation, Armonk, N.Y.

[21] Appl. No.: 481,941

[22] Filed: Feb. 23, 1990

Related U.S. Application Data

[63] Continuation-in-part of Ser. No. 285,435, Mar. 7, 1989, Pat. No. 4,954,142.

[51] Int. Cl.$^5$ ............................................... C09C 1/68
[52] U.S. Cl. ...................................... 51/309; 51/293; 51/307; 51/308
[58] Field of Search ................. 51/293, 307, 308, 309; 106/3

[56] References Cited

U.S. PATENT DOCUMENTS

| | | | |
|---|---|---|---|
| 3,438,811 | 4/1969 | Harriman et al. | 134/2 |
| 4,226,623 | 10/1980 | Koshiyama et al. | 51/309 |
| 4,389,819 | 6/1983 | Williamson et al. | 51/309 |
| 4,475,981 | 10/1984 | Rea | 51/307 |
| 4,529,410 | 7/1985 | Khaladji et al. | 51/309 |
| 4,696,697 | 9/1987 | Kitano et al. | 106/3 |
| 4,702,792 | 10/1987 | Chow et al. | 156/628 |
| 4,769,046 | 9/1988 | Senda et al. | 106/3 |

Primary Examiner—William R. Dixon, Jr.
Assistant Examiner—Willie J. Thompson
Attorney, Agent, or Firm—Ira David Blecker

[57] ABSTRACT

Disclosed is a method of chem-mech polishing an article, preferably an electronic component substrate. The method includes the following steps;
  obtaining an article having at least two features thereon or therein which have a different etch rate with respect to a particular etchant; and
  contacting the article with a polishing pad while contacting the substrate with a slurry containing the etchant wherein the slurry includes abrasive particles wherein the abrasive particles do not include alumina, a transition metal chelated salt, a solvent for the salt, and a small but effective amount of alumina.

The chem-mech polishing causes the at least two features to be substantially coplanar. Also disclosed is the chem-mech polishing slurry.

22 Claims, 2 Drawing Sheets

Cu ETCH REDUCTION WITH Al2O3 ADDITION

Cu ETCH REDUCTION WITH Al2O3 ADDITION

METHOD OF CHEMICAL-MECHANICAL POLISHING AN ELECTRONIC COMPONENT SUBSTRATE AND POLISHING SLURRY THEREFOR

RELATED APPLICATION

This application is a continuation-in-part of U.S. patent application Ser. No. 285,435, filed Mar. 7, 1989, now U.S. Pat. No. 4,954,142, the disclosure of which is incorporated by reference herein.

FIELD OF THE INVENTION

The present invention relates to an improved surface preparation technique for semiconductor chips, ceramic packages, multilayer ceramic packages and other electronic component substrates. More particularly, the invention relates to the planarization of such substrate surfaces according to a chemical-mechanical polishing technique with an improved polishing slurry.

BACKGROUND OF THE INVENTION

A semiconductor chip consists of an array of devices whose contacts are interconnected by patterns of wiring metal strips. In VLSI chips, these metal patterns are multilayered and separated by layers of an insulating material. Interconnections between different metal wiring patterns are made by holes (or via holes), which are etched through the layers of insulating material. Typical chip designs consist of one or two wiring levels, with three wiring levels being the current state of the art. Circuit cost and performance continue to place demand on the fabrication processes in such a way that adding supplementary wiring levels can be competitive even though additional processing steps are required. However, the technique using via-holes, although widely used today, has multiple limitations and drawbacks in that, as the number of metallization layers increases wiring becomes increasingly difficult.

One particular drawback is that the structure produced leads to a very irregular surface, far from planar. Since it is necessary that the structure be planar, the surface is made planar by a variety of planarizing techniques.

It is well known to use ceramic substrates, particularly multilayer ceramic (MLC) substrates, as supports for mounting semiconductor devices thereon.

MLC technology for producing substrates for integrated circuit semiconductor package assemblies is well known in the art. The resultant substrate is capable of mounting many devices which are interconnected by the internal circuitry. External contact is made by a plurality of input/output (I/O) pins on the bottom side. The substrate is provided on the top surface with many small pads which are suitable for making solder connections to corresponding device terminals. Such MLC substrates require a relatively complex metallurgy on the topside to make connections to the integrated circuit devices and provide engineering change pads, and on the bottom to make connection to the I/O pads or other type connections. The complex metallurgy is comprised of several layers of metal which are selectively deposited in a predetermined pattern by additive and/or subtractive photolithographic processes.

Prior to the deposition of the top and bottom surface metallurgy, it may be desirable to planarize the surface of the substrate. The planarization may be accomplished by a variety of planarization techniques.

Instead of placing the top and bottom surface metallurgy directly on the surface of the ceramic substrate, the metallurgy may be placed on an intervening thin film layer (or a plurality of thin film layers) such as that disclosed in Boss et al. U.S. patent application Ser. No. 167,290, filed Mar. 11, 1988, the disclosure of which is incorporated by reference herein.

Again, prior to the deposition of the top and bottom surface metallurgy, it may be desirable to planarize the thin film layer. The planarization may be accomplished by a variety of planarization techniques.

Of the planarization techniques available today, a preferred one for electronic component substrates is chemical-mechanical (hereinafter chem-mech) polishing such as that disclosed in Chow et al. U.S. Pat. No. 4,702,792 and Beyer et al. U.S. patent application Ser. No. 791,860, filed Oct. 28, 1985, the disclosures of which are incorporated by reference herein. Also of interest is Rea U.S. Pat. No. 4,475,981, the disclosure of which is also incorporated by reference herein. Chem-mech polishing essentially enhances the removal of surface material by mechanically abrading the surface while applying an etchant that chemically attacks the surface. In order for chem-mech polishing to work, there must be at least two materials having differing etch rates such that the etchant affects one material more than the other. The effectiveness of the chem-mech polishing method ultimately depends on the precise etchant chosen.

For one reason or another, the chem-mech polishing slurries of the prior art have failed to produce a substrate surface that is acceptably planar.

Accordingly, it is an object of the present invention to have an improved chem-mech polishing method and slurry.

It is another object of the present invention to have an improved chem-mech polishing method and slurry that is available for use on a plurality of different material combinations.

These and other objects of the invention will become more apparent after referring to the following description considered in conjunction with the accompanying drawings.

BRIEF SUMMARY OF THE INVENTION

The objects of the invention have been achieved by providing, according to one aspect of the invention, a chem-mech polishing slurry comprising;
  abrasive particles wherein said abrasive particles do not include alumina;
  a transition metal chelated salt;
  a solvent for said salt; and
  a small but effective amount of alumina.

According to a second aspect of the invention there is provided a method of chem-mech polishing an article, preferably an electronic component substrate. The method comprises the following steps:
  obtaining an article having at least two features thereon or therein which have a different etch rate with respect to a particular etchant; and
  contacting said article with a polishing pad while contacting said article with a slurry containing said etchant wherein said slurry comprises abrasive particles wherein said abrasive particles do not include alumina, a transition metal chelated salt, a solvent for said salt and a small but effective amount of alumina;

said chem-mech polishing causing said at least two features to be substantially coplanar.

DETAILED DESCRIPTION OF THE INVENTION

Figure 1:
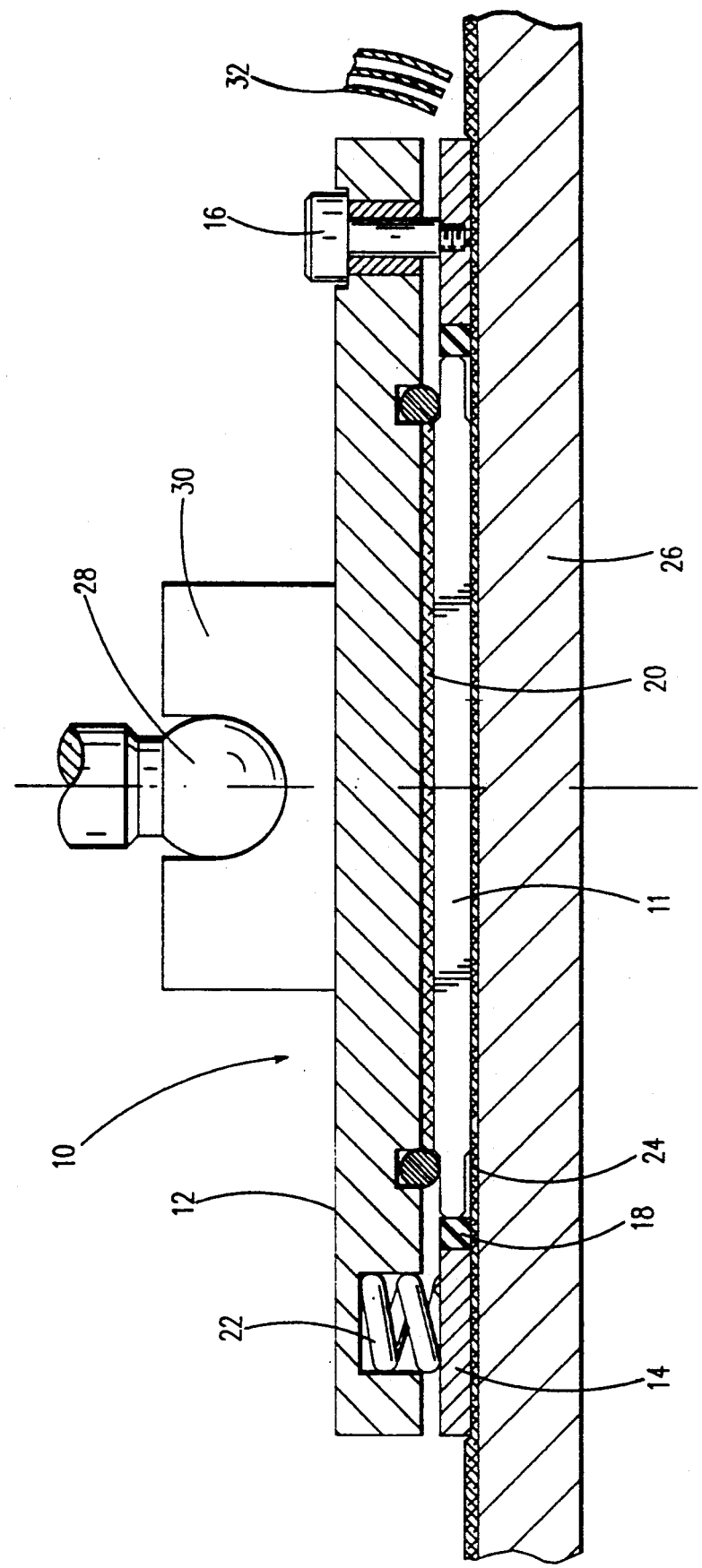
FIG. 1 is a cross-sectional view of a fixture for holding an electronic component substrate during polishing.

The invention broadly relates to the chem-mech polishing of an article, most preferably an electronic component substrate. The particular electronic component substrate can be, for example, a semiconductor chip, a ceramic substrate or a multi-layer ceramic substrate. Other types of articles and electronic component substrates, while not specifically mentioned here, should also be considered to be within the scope of the present invention.

In the method according to the invention, it is necessary to have an electronic component substrate that has at least two features thereon or therein which have a different etch rate with respect to a particular etchant. For example, these two features may be a polyimide layer having copper studs therein such as that disclosed in the above Boss et al. patent application. As another example, the two features may be a ceramic substrate having metallic vias. In any case, it is necessary that the two features etch at different rates when contacted with a particular etchant. It is not necessary that both of the features be actually attacked by the etchant as it often is acceptable for one of the features to be attacked while the other feature (or features) is relatively inert with respect to the particular etchant and thus has a much lower etch rate.

The substrate is then contacted with a polishing pad while also being contacted with a slurry containing the particular etchant.

According to the invention, the slurry comprises abrasive particles, a transition metal chelated salt and a solvent for the salt. The transition metal chelated salt while in solution provides the chemical or etching action while the abrasive particles, in cooperation with the polishing pad provides the mechanical action. Most importantly, as will become apparent hereafter, the abrasive particles do not include alumina. Further, the slurry must comprise a small but effective amount of alumina. The amount of alumina that is actually present can be as little as that which is normally considered to be an impurity.

The abrasive particles can be any of those commonly available such as silica ($SiO_2$), ceria ($CeO_2$), silicon carbide (SiC), silicon nitride ($S_3iN_4$), iron oxide ($Fe_2O_3$), etc. The abrasive particles may comprise about 1-30 weight percent of the slurry composition, the exact amount depending upon the degree of abrasion required. Once again, the choice of the abrasive particles, i.e., those particles that are primarily responsible for the abrasion of the article, does not include alumina.

The transition metal chelated salt may comprise most of any of the transition metals with the preferred ones being iron, cobalt or nickel. It is the presence of the transition metal that makes this type of etchant so effective. The solvent chosen should be tailored to the particular transition metal chelated salt. Preferably, the chelated salt should be soluble in water. Some of the water-soluble chelating agents that could be suitable for the present invention are anions of ethylenediaminetetraacetic acid (EDTA), N-hydroxyethylethylenediaminetriacetic acid (NHEDTA), nitrilotriacetic acid (NTA), diethylenetriaminepentaacetic acid (DTPA), ethanoldiglycinate (EDG) and citrates. If an organic vehicle was preferred, a porphin structure (soluble in dimethylformamide or methanol) could also be suitable. Generally, the transition metal chelated salt will comprise about 0.1-10 weight percent of the slurry composition, depending on the degree of chemical attack required.

The preferred transition metal chelated salt is ammonium iron EDTA because of its low cost, ready availability and ability to complex with copper and hydrolyze silicate structures. Harriman et al. U.S. Pat. No. 3,438,811, the disclosure of which is incorporated by reference herein, illustrates the ability of Fe(EDTA) (as well as other chelating agents) to etch copper. See also Technical Information, "Chelating Agents in Oxidation-Reduction Reactions", Organic Chemicals Division, W. R. Grace & Co., Lexington, Mass. Transition metal chelate salt slurries are of interest generally because they are of moderate pH (pH 2-10), chemically more selective, and less likely to attack the polishing equipment than other known etchants and reasonably safe for human contact. Further, transition metal chelated salts minimize precipitation and residue and can often be regenerated if desired. Finally, compared to other etchants, the transition metal chelated salts easily rinse off the surface being polished and thus leave no residue.

A preferred embodiment of the present invention is to chem-mech polish copper with another feature such as a polyimide thin film or glass ceramic. The glass ceramic may be any of those glass ceramics disclosed in Kumar et al. U.S. Pat. Nos. 4,301,324 and 4,413,061. However, it should be understood that the teachings of the present invention have applicability to other combinations of features such as aluminum metallurgy with silica, tungsten metallurgy with silica, copper metallurgy with silica, molybdenum metallurgy with alumina or silica with silicon.

It is also preferred that the slurry further comprise a passivating agent, generally in the range of 0.01-0.5 weight percent of the slurry composition. The purpose of the passivating agent is to control the etch rate of at least one of the features. For the etching of copper, a preferred passivating agent is a phosphate. The phosphate may be, for example, dilute phosphoric acid or ammonium phosphate which is added in an effective amount sufficient for passivation. As will be shown hereafter, the presence or absence of the passivating agent is very important in determining the final polished structure.

It has been found that while the above-described invention works well enough in practice, the results obtained are often unpredictable. The unpredictability can sometimes be traced to differences in batches of the etchant as well as to the different manufacturers of the etchants themselves. Needless to say, it would be extremely desirable to obtain consistent, predictable results, regardless of the source or batch of the etchant.

It has been discovered that very small amounts of alumina, when added to the etchant-containing chem-mech slurry, are effective in improving the consistency and predictability of the chem-mech polishing process. While it has been found that alumina amounts as little as 0.003 weight percent lead to such dramatic improvements, it is firmly believed that any amount of alumina, perhaps on the impurity level, would be beneficial.

The reason why such small additives of alumina are so effective in the chem-mech polishing process is unclear. While not wishing to be held to a particular theory, it is believed that since such small amounts of alumina exhibit such a dramatic effect, the alumina must regulate the chemical activity of the etchant by forming a coating on the feature which is attacked by the etchant. It may be further suggested that the small amounts of alumina contemplated here primarily act chemically, and not mechanically. It is known that the etching rate of the etchant is decreased with increasing amounts of alumina.

The upper limit on the additions of alumina is not quite so clear. Alumina additions of 0.25 weight percent are known to greatly slow down the etching process, leading to long cycle times. It is believed that alumina additions greater than about 1 weight percent would detrimentally affect the etching process such that the chem-mech polishing of a given article would be, as a practical matter, primarily a mechanical (abrasion) process.

In view of the above, the desirable range for the alumina addition is 0.001 to 1 weight, preferably 0003 to 0.25 weight percent and most preferably, 0.03 to 0.06 weight percent.

The advantages of the invention will become more apparent after referring to the following examples.

EXAMPLES

Example 1

A slurry consisting of 2.5 weight percent colloidal silica, 0.8 weight percent ammonium iron EDTA (Hamp-ene ® Photoiron, available from Hampshire Organic Chemicals Division, W. R. Grace & Co.), remainder deionized water was fed to a polishing machine with a blown polyurethane pad. A separate solution of dilute phosphoric acid was added to the slurry stream to produce a pH of about 2.7. Glass ceramic substrates having copper vias were chem-mech polished at a pressure of 8.7 psi for about 20 minutes. A smooth surface was produced on the glass ceramic and the copper vias were within 1000–3000 Å of being planar with the surface.

Example 2

Two polishing slurries were prepared. The first slurry consisted of 2 weight percent silica having a particle size of 30–70 Å, 2 weight percent ammonium iron EDTA, remainder deionized water. The second slurry was identical to the first slurry except that it contained dilute phosphoric acid (to a pH of about 2.7) as a passivator. The two slurries were utilized to chem-mech polish a glass ceramic substrate having a polyimide thin film, copper stud and an overlayer of 25 microns of sputtered chromium and copper metal. In the first cycle, the substrate was treated with the passivated slurry for about 1 minute to protect any recessed features from the unpassivated ammonium iron EDTA. Throughout the polishing process, the polishing pad was applied with a pressure of about 20–30 psi. In the second cycle, the unpassivated slurry was applied for about 25 minutes to remove most of the overlayer of sputtered metal. Next, the passivated slurry is applied for about 25 minutes to remove the remaining amount of the copper stud. At this point, the copper features may be somewhat recessed. If so, then, the final step is to do a brief mechanical only polish (with, for example, a 20 weight percent silica only slurry) for about 5 minutes to bring the level of the polyimide down to that of the copper stud. After chem-mech polishing, the copper studs were planar within 1000 Å of the polyimide.

Example 3

The identical polishing procedures and slurries were utilized to chem-mech polish a silicon wafer having a polyimide thin film with copper features. There additionally was a 1 micron thick blanket layer of sputtered copper on the polyimide. The polishing pad was applied at a pressure of about 2–10 psi. The times for each of the steps as explained above was about 20 seconds, 2 minutes, 2 minutes and 2 minutes. After chem-mech polishing, the copper features were planar within 1000 Å of the polyimide.

Example 4

A slurry consisting of about 4 weight percent NALCO 2360 Colloidal silica, about 1.8 weight percent ammonium iron EDTA (NOAH Chemical Co.), remainder deionized water was fed to a polishing machine with a perforated pad. Glass ceramic substrates having polyimide films, copper studs and an overlayer of sputtered chromium and copper were chem-mech polished at a machine pressure of about 15–20 psi for about one hour. A smooth surface on the polyimide was produced and the copper vias were recessed within 1–3 microns of the polyimide surface. Then, a mechanical polish (with abrasives only) was undertaken to remove the polyimide and make the copper studs completely coplanar with the polyimide.

The mechanical polish in this case was a two-step polish. The first polish consisted of about 24.5 weight percent NALCO 2360 Colloidal silica, about 2 weight percent 0.05 micron gamma alumina, remainder deionized water. The second polish. The second polish consisted of about 20 weight percent colloidal silica, remainder deionized water.

An interesting aspect of the present invention is that the chem-mech and mechanical polishes may be fed in different streams to the polishing pad and substrate so that the respective streams may be essentially blended together to any desired degree for optimum results. For example, the chem-mech polish may be fed to the polishing pad for a predetermined length of time. Thereafter, the chem-mech polish may be gradually diminished while starting and then increasing the flow of the mechanical polish.

Shown in the Figure is a fixture, generally indicated by 10, for holding an electronic component substrate during the polishing steps according to the present invention. The electronic component substrate in the Figure is a glass ceramic substrate having a thin film structure as described previously.

The fixture 10 consists of a base plate 12 and a pressure plate 14. The pressure plate 14 is held to the base plate 12 by stripper bolts 16. The substrate 11 is secured within the pressure plate 14 against base plate 12 and reset nylon 18. If necessary, padding 20 is supplied to protect the substrate. Springs 22 are supplied to adjust the tension between the pressure plate 14 and base 12. The fixture 10 is held against the polishing pad 24 and polishing table 26 by quill 28 and bracket 30.

In operation, pressure is applied through quill 28 which causes pressure plate 14 to depress the polishing pad 24. The stronger the spring 22, the more the polishing pad is depressed. This, in turn, lessens the pressure exerted against the edges of substrate 11 by polishing pad 24. Consequently, the edge effects of polishing are largely negated and the substrate surface may be uniformly polished.

Tubes 32 are provided for flowing a stream of slurry. Due to the plurality of tubes provided, the slurry composition may be infinitely varied.

Example 5

Glass ceramic substrates were obtained having a polyimide thin film, copper studs and an overlayer of about 25 microns of sputtered chromium and copper metal. Slurries were prepared having 1.2 weight percent ammonium iron EDTA (W. R. Grace), 2 weight percent colloidal silica abrasive particles (Nalco 2360) and deionized water. The pH of the slurry was adjusted to 9.0 to 9.5 with ammonium hydroxide. The slurries also contained varying amounts of $0.05\mu$ gamma alumina (Leeco) as indicated in Table I.

The substrates were placed in a fixture as shown in FIG. 1 and as described previously in Example 4. The substrates were pressed against a polyurethane pad with a resultant pressure on the substrate of about 3 psi. The substrate was rotated at a quill speed of 60 rpm while the table was rotated at a speed of 100 rpm. The chem-mech slurry was dispensed at 80 milliliters/minute.

After 1½ hours of polishing the chrome/copper blanket was gone and the copper studs had been attacked by the etchant to varying degrees. It was observed that the studs at the corners of the substrates were attacked more than those at the center of the substrate. This result was not unexpected since the slurry is fed from the periphery of the substrate and so the etchant should be partially spent by the time it reaches the center of the substrate. Accordingly, etchant attack at the center should be lessened somewhat.

What was unexpected, and quite surprising as well, was that for a given location on the substrate, the depth of attack by the etchant decreased dramatically with increasing amounts of alumina.

Referring now to Table I, it can be seen that without alumina, the depth of attack of the stud by the etchant was $7\mu$ at the center and $14\mu$ at the corner. As a practical matter, the stud was completely etched down to the capture pad at the corner.

With alumina, however, it can be seen that the depth of attack dramatically decreased with increasing, but small, amounts of alumina. At 0.25 weight percent alumina, the depth of attack was essentially zero. It may be concluded that the chem-mech polishing slurry with this amount of alumina results primarily in a mechanical polish. Of course, if the etchant concentration were increased or other parameters were changed, greater amounts of alumina might be desirable, but in any event probably no greater than about 1 weight percent.

It has been found that with the alumina additions, a consistent and predictable chem-mech polish has been obtained in that the studs are etched to a predetermined depth, time after time, independent of the batch or manufacturer of the etchant.

TABLE I

| W/O $Al_2O_3$ | Decrease In Stud Height, Center ($\mu$) | Decrease In Stud Height, Corner ($\mu$) |
| --- | --- | --- |
| 0 | 7 | *14 |
| .007 | 0 | 8 |
| .03 | 0 | 4 |
| .05 | 0 | 2 |
| .25 | 0 | ½ |

*Stud etched completely down to capture pad.

In order to determine the minimum amount of alumina necessary to obtain efficacious results, a further experiment was conducted. A glass ceramic substrate as described above was obtained. This substrate, however, had already been chem-mech polished to some degree, thereby evidencing depressed studs. The substrate was chem-mech polished for 15 minutes with the slurry described above but without alumina. The incremental depth of attack of the studs due to this polishing step was measured. Then, the substrate was chem-mech polished again for 15 minutes; however, this time, the slurry contained 0.003 weight percent alumina. The incremental depth of attack of the studs due to this second polishing step was again measured and found in to be less than the incremental depth of attack by the slurry without alumina.

Figure 2:
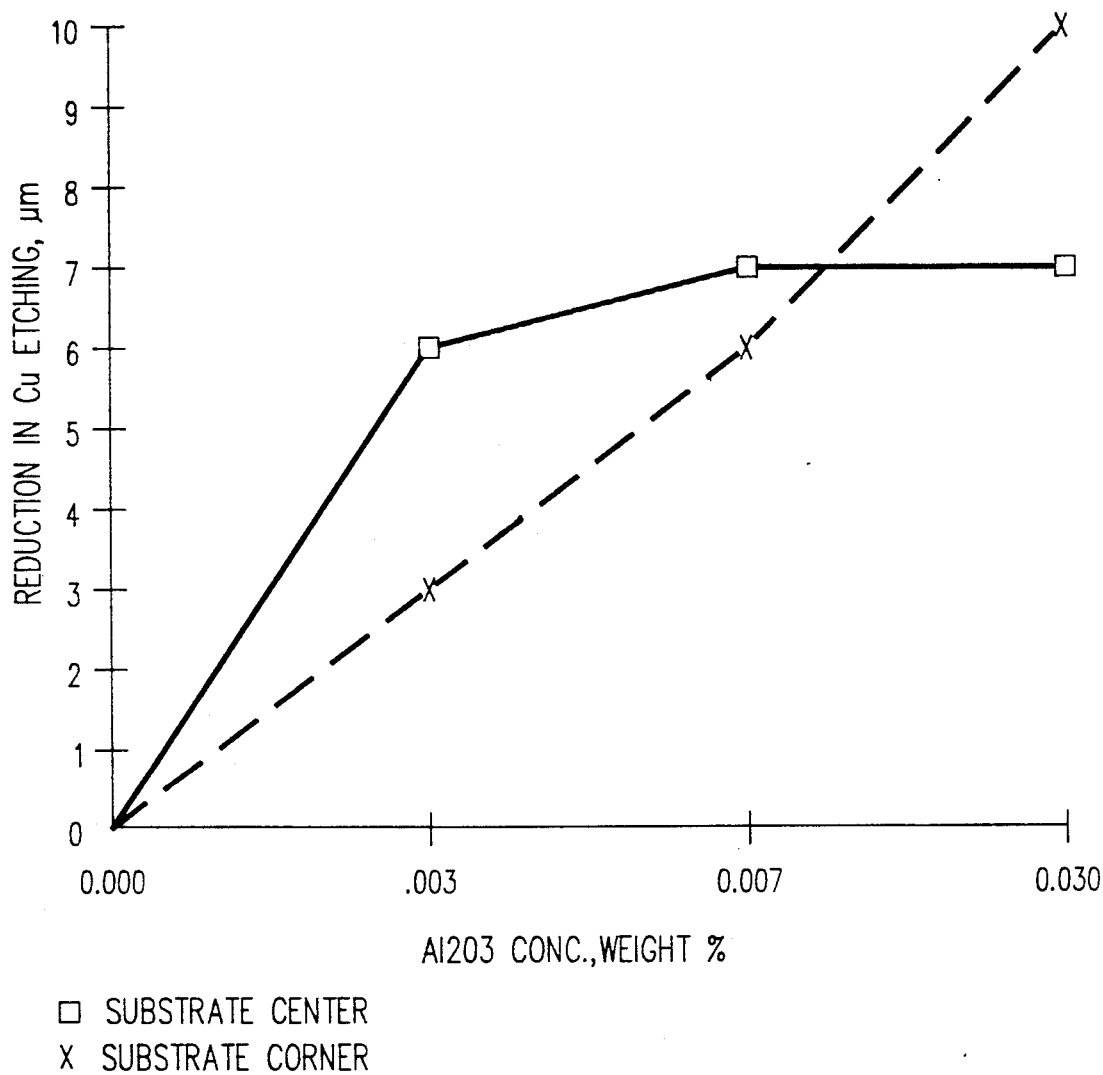
FIG. 2 is a graph showing the reduction in etching of copper vias with small but effective amounts of alumina.

The graph of FIG. 2 was obtained by subtracting the second incremental depth of attack (with the slurry containing 0.003 weight percent alumina) from the first incremental depth of attack (with the slurry not containing alumina). The numbers were multiplied by 6 to normalize the results to a standard polishing time of 1½ hours. The remaining data points in FIG. 2 were obtained from the data in Table I. The results show that the etching rate of attack (i.e., the incremental depth of attack) was decreased in every case with the additions of alumina, even down to 0.003 weight percent. From the graph, it can be extrapolated that less than 0.003 weight percent alumina (perhaps an order of magnitude less) would be effective according to the invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A chem-mech polishing slurry comprising:
   abrasive particles wherein said abrasive particles do not include alumina;
   a transition metal chelated salt;
   a solvent for said salt; and
   a small but effective amount of alumina to regulate the etching rate of attack of said slurry.

2. The slurry of claim 1 wherein the maximum amount of said alumina present is 1 weight percent.

3. The slurry of claim 1 wherein the maximum amount of said alumina present is 0.25 weight percent.

4. The slurry of claim 1 wherein said alumina is present in the range of 0.001 to 1 weight percent.

5. The slurry of claim 4 wherein said range is 0.003 to 0.25 weight percent.

6. The slurry of claim 5 wherein said range is 0.03 to 0.06 weight percent.

7. The slurry of claim 1 wherein said transition metal chelated salt is present in the range of about 0.1 to 10 weight percent and said abrasive particles are present in the range of about 1 to 30 weight percent.

8. The slurry of claim 1 wherein said transition metal in said transition metal chelated salt is selected from the group consisting of iron, cobalt and nickel.

9. The slurry of claim 8 wherein said transition metal chelated salt is ammonium iron EDTA and said slurry is aqueous.

10. The slurry of claim 1 wherein said abrasive particles are selected from the group consisting of silica, ceria, silicon carbide, silicon nitride and iron oxide.

11. A method of chem-mech polishing an article, the method comprising the following steps:
    obtaining an article having at least two features thereon or therein which have a different etch rate with respect to a particular etchant; and
    contacting said article with a polishing pad while contacting said article with a slurry containing said etchant wherein said slurry comprises abrasive particles, wherein said abrasive particles do not include alumina, a transition metal chelated salt, a solvent for said salt and a small but effective amount of alumina to regulate the etching rate of attack of said slurry,
    said chem-mech polishing causing said at least two features to be substantially coplanar.

12. The method of claim 11 further comprising the step of mechanically polishing said at least two features after the step of chem-mech polishing.

13. The method of claim 11 wherein the maximum amount of said alumina present is 1 weight percent.

14. The method of claim 11 wherein the maximum amount of said alumina present 0.25 weight percent.

15. The method of claim 11 wherein said alumina is present in the range of 0.001 to 1 weight percent.

16. The method of claim 15 wherein said range is 0.003 to 0.25 weight percent.

17. The method of claim 16 wherein said range is 0.03 to 0.06 weight percent.

18. The method of claim 11 wherein said transition metal chelated salt is present in the range of about 0.1 to 10 weight percent and said abrasive particles are present in the range of about 1 to 30 weight percent.

19. The method of claim 11 wherein said transition metal in said transition metal chelated salt is selected from the group consisting of iron, cobalt and nickel.

20. The method of claim 19 wherein said transition metal chelated salt is ammonium iron EDTA and said slurry is aqueous.

21. The method of claim 11 wherein said abrasive particles are selected from the group consisting of silica, ceria, silicon carbide, silicon nitride and iron oxide.

22. The method of claim 11 wherein said article is an electronic component substrate.

* * * * *